United States Patent [19]
Sohn

[11] Patent Number: 5,736,946
[45] Date of Patent: Apr. 7, 1998

[54] HIGH SPEED APPARATUS AND METHOD FOR DECODING VARIABLE LENGTH CODE

[75] Inventor: Young-Seok Sohn, Seoul, Rep. of Korea

[73] Assignee: Daewoo Electronics Co., Ltd., Seoul, Rep. of Korea

[21] Appl. No.: 706,163

[22] Filed: Aug. 30, 1996

[30] Foreign Application Priority Data

Aug. 31, 1995 [KR] Rep. of Korea ............... 95-28089

[51] Int. Cl.[6] ....................................... H03M 7/40
[52] U.S. Cl. ................................. 341/67; 341/106
[58] Field of Search ......................... 341/67, 65, 55, 341/63, 106

[56] References Cited

U.S. PATENT DOCUMENTS

5,173,695 12/1992 Sun et al. ........................... 341/67

Primary Examiner—Brian K. Young
Attorney, Agent, or Firm—Anderson, Kill & Olich, P.C.

[57] ABSTRACT

An efficient method and apparatus for decoding sequential variable-length codewords includes a first barrel shifter for producing a first window output sequence in response to a window control signal, a second barrel shifter for producing a second window output sequence and a code value in response to a decoded codeword length, a relay circuit for latching the second window output sequence for one-half the clock cycle and providing the latched second window output sequence as a decoding output sequence, a first look-up table memory for producing the decoded codeword length in response to a pre_fix code of the variable-length codeword that begins at the first bit position of the decoding output sequence, a second look-up table memory for producing a fixed-length word in response to the decoded codeword length and the code value, and an accumulation block for producing the window control signal.

14 Claims, 3 Drawing Sheets

| AcBbbCcc | cDDddEE | EeeeFFFF | fffGGGGG | gggHHHHH | hhhIIIii |

INPUT BIT STREAM

FIG. 3

| | LEAD111 | LATCH101 | LATCH102 | LEAD117 | LEAD119 | CODE VALUE(121) | DECODED WORD(213) | CODEWORD LENGTH(211) | CARRY | READ | | |
|---|---|---|---|---|---|---|---|---|---|---|---|---|
| 1F | | //// //// | //// //// | //// //// | //// //// | //// //// | //// //// | x | 1 | 1 | 18 | 16 |
| 2R | AcBbbCcc cDDddEE | //// //// | //// //// | //// //// | //// //// | //// //// | //// //// | x | 1 | 1 | 18 | 24 |
| 3F | AaBbbCcc cDDdddEE | AaBbbCcc cDDdddEE | //// //// | //// //// | AaBbBCcc | //// //// | 111 | x | 1 | 1 | 18 | 16 |
| 4R | EeeeFFFF ffGGGGG | AaBbbCcc cDDdddEE | AaBbbCcc cDDdddEE | cDDdddEE | BbbCcccD | //// //// | 111 | A' | 1 | 1 | 2 | 24 |
| 5F | EeeeFFFF ffGGGGG | EeeeFFFF ffGGGGG | AaBbbCcc cDDdddEE | DdddEEEe | CcccDDdd | //// //// | 1Aa AaBbbCcc | B' | 0 | 0 | 3 | 10 |
| 6R | EeeeFFFF ffGGGGG | EeeeFFFF ffGGGGG | AaBbbCcc cDDdddEE | dEEEeeeF | DDddEEE | AaBbbCcc | BbbCcccD | C' | 0 | 0 | 4 | 13 |
| 7F | EeeeFFFF ffGGGGG | EeeeFFFF ffGGGGG | AaBbbCcc cDDdddEE | eeeFFFFf | EEEeeeFF | BbbCcccD | CcccDDdd | D' | 1 | 1 | 5 | 17 |
| 8R | gggHHHH hhhIiii | EeeeFFFF ffGGGGG | AaBbbCcc cDDdddEE | FFFffGGG | FFFFffG | CcccDDdd | DDddEEEddd | E' | 1 | 1 | 6 | 22 |
| 9F | gggHHHH hhhIiii | gggHHHH hhhIiii | EeeeFFFF ffGGGGG | GGGGgghH | GGGGggg | DDddEEE ddd | EEEeeeFF eee | F' | 0 | 0 | 7 | 12 |

WINDOW CONTROL SIGNAL(319)
DECODING OUTPUT SEQUENCE(127)

HIGH SPEED APPARATUS AND METHOD FOR DECODING VARIABLE LENGTH CODE

FIELD OF THE INVENTION

The present invention relates to a variable length code (VLC) decoding apparatus and method; and, more particularly, to an improved VLC decoding apparatus and method which is capable of providing a high speed decoding operation by decoding two codewords for each clock cycle.

DESCRIPTION OF THE PRIOR ART

Variable length coding is a technique often used for lossless data compression. This technique is used to convert fixed-length data to variable-length codewords based on the statistical occurrences of the data. The codeword lengths are chosen in such a manner that shorter codewords are used to represent more frequently occurring data and longer codewords are selected to represent less frequently occurring data. By properly assigning the variable-length codewords to a library of all possible source codewords, the average word length of the variable-length codewords becomes shorter than that of the original data, thereby rendering it possible to achieve data compression.

In this connection, Huffman code design is a procedure commonly used to construct a minimum redundant variable length code for known data statistics. In general the encoding process can be implemented by a table-lookup process using input data to address the table. The codewords and the word-length information are stored as contents of the table and outputted sequentially through the use of a buffer at a constant data rate onto the data channel.

At the receiving end of the encoded or compressed data, however the decoding process may become more complicated. Owing to the varying length, each codeword has to be segmented from the received bit string before it can be decoded into a source symbol. Therefore, the design of a variable length decoder is more difficult than that of a variable length encoder.

There are several known apparatus for use to decode a stream of variable length codewords. Among them, most often used is a VLC decoder employing a tree-searching algorithm such as the one disclosed in U.S. Pat. No. 4,899,149 issued on Feb. 6, 1990 to Gary Kahan. In this device, a variable length code is represented by a tree with codewords as leaves(also called terminal nodes). The decoding process starts from the root of the code tree and is guided by the received bit stream to follow one of two branches at each node. When a leaf is reached, the end of a codeword is detected and is segmented from the remaining bit stream. This type of decoding apparatus includes a logic circuitry corresponding to the tree and a control circuitry to traverse the code tree. This approach may be slow, however, especially for long codewords, since a bit-by-bit search through the code tree is required for each decoded symbol.

A lookup-table based VLC decoder is disclosed in U.S. Pat. No. 5,173,695 issued on Dec. 22, 1992 to Ming-Ting Sun, et al.; and U.S. Pat. No. 5,245,338 to Ming-Ting Sun. That decoder includes two cascaded latch circuits, each having a bit capability equal to the maximum codeword length, which store consecutive bits supplied from an input buffer memory for storing the stream to be decoded in fixed-length data segments; a barrel shifter connected to the two latch circuits for providing a sliding decoding window output equal in length to the maximum codeword length; an accumulator which accumulates, modulo the maximum codeword length, the lengths of sequentially decoded variable length codewords; and a lookup-table memory device for outputting a fixed-length word corresponding to a variable-length codeword contained in the sliding decoding window output and for outputting a length of the variable-length codeword. As a codeword is decoded during each clock cycle, its length is accumulated and the decoding window of the barrel shifter is shifted to begin with the first bit of the next codeword to be decoded. When, during a clock cycle, the accumulated length exceeds the maximum codeword length, which would indicate that all the bits in the second latch circuit have been decoded, the bits in the first latch circuit are transferred into the second latch circuit and the next fixed-data segment of bits is read into the first latch circuit from the input buffer memory.

In the afore-described decoder structure, the operational speed is limited by the operational delay of the components in a critical path that includes the lookup-table memory, the barrel shifter, and the accumulator. And, its operational speed is further hampered by its limited ability to decode only one codeword for each clock cycle.

Consequently, decoders capable of decoding two codewords for each clock cycle have been proposed to improve the speed of decoding a series of variable length codewords. One of such decoders is disclosed in a commonly owned copending application, U.S. Ser. No. 08/616,941, filed on Mar., 18, 1996 and entitled "HIGH SPEED VARIABLE LENGTH CODE DECODING APPARATUS".

Despite the marked improvements made with respect to the speed of the decoding operation in the above copending application, however, there continues to exist a need for further reducing the complexity of the decoder structure.

SUMMARY OF THE INVENTION

It is, therefore, a primary object of the invention to provide a VLC decoding apparatus and method, which reduces the structural complexity thereof while being able to decode two codewords for each clock cycle by using both falling and rising edges of a clock cycle to enhance the operation speed thereof.

In accordance with the present invention, a VLC decoding method for decoding at a half clock rate, based on a clock signal having two types of clock ticks, sequential variable-length codewords supplied from an input buffer which stores an input bit stream to be decoded in fixed-length segments having a length equal to twice a longest length of the variable-length codewords, the method comprising the steps of: (a) storing first and second sequential fixed-length segments of the input bit stream; (b) forming from said two stored fixed-length segments a decoding window of a subsequence of input bits which has equal bit length to the longest length of the variable-length codewords during each half clock cycle; (c) comparing the initial bits in the decoding window with all possible variable-length codewords to determine one matching variable-length codeword; (d) generating a codeword length during each half clock cycle that represents the bit-length of the matched variable-length codeword; (e) producing a fixed-length word corresponding to the matched variable-length codeword during each half clock cycle; (f) summing the generated codeword length and a previously accumulated codeword length during each half clock cycle; (g) directly shifting the decoding window during each half clock cycle by the number of bits in the matched variable-length codeword; (h) reading in a next fixed-length segment of the input bit stream when the accumulated codeword length indicates that all the bits in the first fixed-length segment have been decoded; (i) storing the second fixed-length segment of input bits in place of the first fixed-length segment of bits while storing the next fixed-length segment of input bit stream read in step (h) in place of the second fixed-length segment of input bits when the accumulated codeword length indicates that all the bits in the first fixed-length segment have been decoded; (j) subtracting twice the longest length of the variable-length codewords from the accumulated codeword length when the accumulated codeword length exceeds twice the longest length of the variable-length codewords; and (k) repeating steps (a) to (j) until all the variable-length codewords in the input bit stream are decoded.

BRIEF DESCRIPTION OF THE DRAWINGS

The above and other objects and features of the instant invention will become apparent from the following description of preferred embodiments taken in conjunction with the accompanying drawings, in which.

DETAILED DESCRIPTION OF THE PREFERRED EMBODIMENTS

Figure 1:
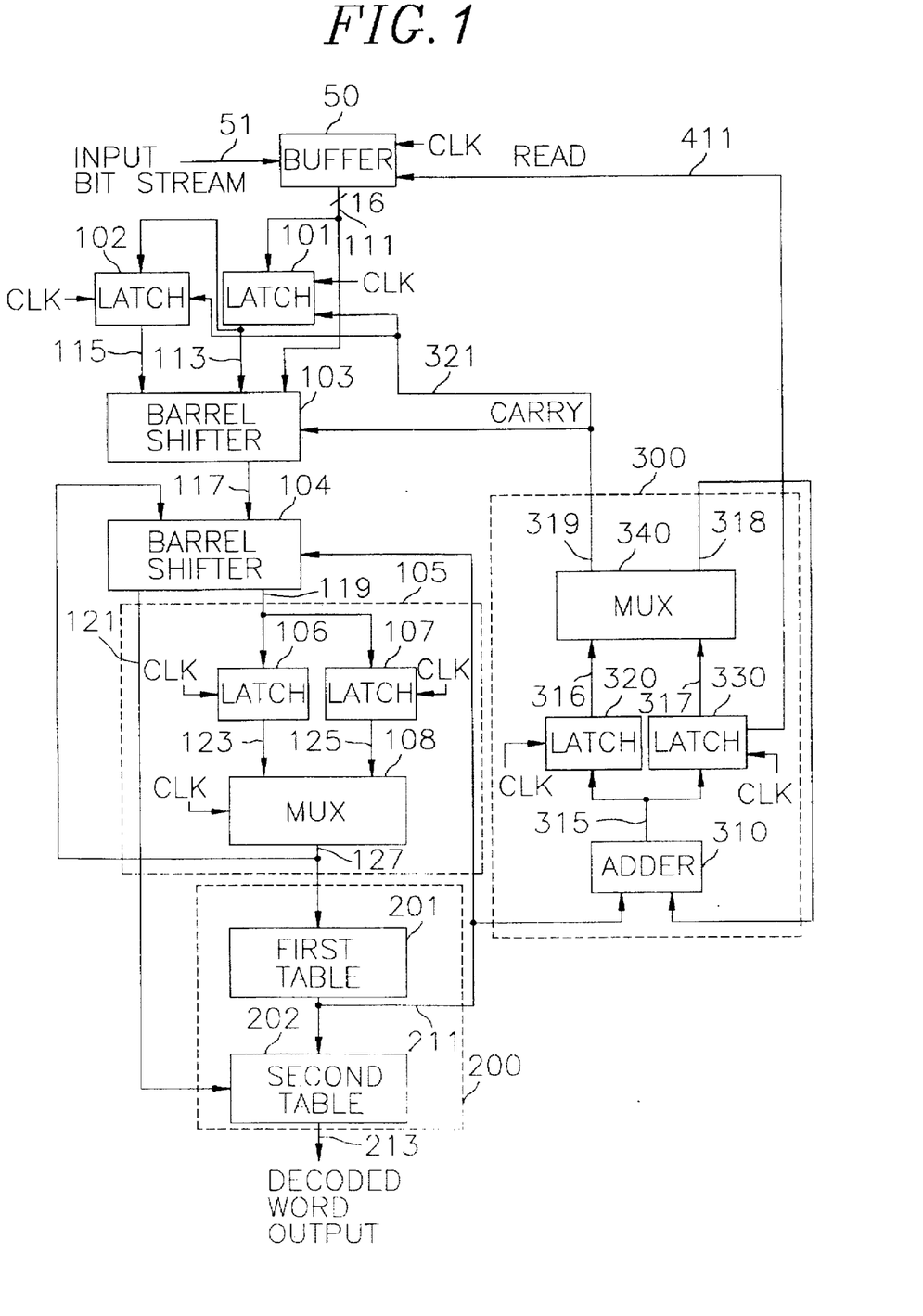
FIG. 1 shows a schematic diagram of a VLC decoding apparatus in accordance with the present invention.

In the embodiment of the present invention shown in FIG. 1, it is assumed for illustrative purposes that the maximum length of the variable-length codewords to be decoded is 8-bits. The VLC decoder decodes successive variable-length codewords inputted thereto in a continuous bit stream and outputs decoded fixed-length codewords corresponding thereto, in response to a fixed symbol clock, on a lead 213.

A serial data stream received on a data channel 51 is inputted to an input buffer memory 50 which stores, in fixed-length data segments, the serial data stream of variable-length codewords and sequentially outputs the fixed-length data segments, e.g., 16-bit segments on a lead 111 at a clock tick, e.g., a rising clock tick of a clock signal CLK in response to a READ signal on a lead 411, wherein the bit length of the data segment is twice the maximum bit length of the variable-length codewords and the clock signal has two types of clock tick, a falling edge one and a rising edge one.

A latch circuit 101 is connected to the input buffer memory 50 and sequentially receives the fixed-length data segments on the lead 111 from the input buffer memory 50. A latch circuit 102 is connected to the latch circuit 101 and receives the fixed-length data segment previously held in the latch circuit 101. The latch circuits 101 and 102 are controlled latches which latch-in the data at their inputs at a clock tick of the CLK only when a CARRY signal is present at their control inputs, wherein the latched data are retained at their outputs until the next clock tick of the CLK. In the preferred embodiment of the invention, the input buffer memory 50, and the latch circuits 101 and 102 operate at a different type of clock tick of the clock signal. As will be described, the latch circuits 101 and 102 read-in the data at their inputs, e.g., at a falling clock tick of the CLK, when an accumulation block 300 generates a CARRY signal on a lead 321. When a new data segment needs to be supplied, a READ signal is activated on the lead 411. When the READ signal on the lead 411 is activated, a next data segment is retrieved from the input buffer memory 50 onto the lead 111 at a rising clock tick of the CLK. In response to a CARRY signal and at the next falling clock tick of the CLK, the latch circuit 101 latches the next data segment on the lead 111; the data segment previously held in the latch circuit 101 is latched into the latch circuit 102. Therefore, the data contained in the latch circuit 102 is always sequentially earlier in time than the one contained in the latch circuit 101.

The data segments of the latch circuits 102 and 101 and the output of the input buffer memory 50 on the lead 111 are inputted to a first barrel shifter 103, which has a consecutive 48-bits of the data stream supplied thereto. The first barrel shifter 103 has an 8-bit slidable output window movable across the 48-bits inputted thereto, wherein the position of the output window is controlled by a window control signal indicating accumulated codeword lengths supplied through a lead 319 from the accumulation block 300. When the window control signal is activated on the lead 319, the 8-bit output window of the first barrel shifter 103 is directly shifted to include in it a next 8-bit sequence of the data segments in the first barrel shifter 103 as indicated by the window control signal. When the CARRY signal on the lead 321, which is activated when the first 16-bits of the data stream in the first barrel shifter 103 have been read-out to a second barrel shifter 104, is activated, the previous data segment in the latch circuit 101 is latched into the latch circuit 102 as a twice previous date segment and the current data segment on the lead 111 is latched into the latch circuit 101 as the previous data segment, in response to a clock tick of the falling edge. And, at a next clock tick of the rising edge, the next 16-bit data segment is retrieved from the input buffer memory 50 and appears at input bit positions 33–48 of the first barrel shifter 103 as a current data segment. The output from the first barrel shifter 103, i.e., the first window output sequence, is an 8-bit sequence from the 48 bit data stream consisted of the three input data segments, i.e., the twice previous data segment and the previous data segment outputted from the latch circuits 102 and 101, and the current data segment outputted from the buffer memory 50; and is supplied to the 16-bit input second barrel shifter 104 over a lead 117. The second barrel shifter 104 also receives an 8-bit decoding output sequence produced at the previous clock tick through a lead 127 in order to produce a next output sequence.

The second barrel shifter 104, which has an 8-bit slidable output window movable across the 16-bits inputted thereto and is controlled by a codeword length supplied through a lead 211 from a memory device 200, serves to output a second window output sequence to a lead 119 by using its slidable output window, which slides to a new position determined by the codeword length on the lead 211; and to simultaneously produce a code value of M, e.g., 3 bits to the memory device 200 through a lead 121, M being an integer smaller than the maximum length of the variable-length codeword. In a preferred embodiment of the invention, a 3-bit sequence in the 16-bit input data is defined as the code value, wherein the 3-bit sequence is left-positioned from the first bit in the second window output sequence. If the number of bits left-positioned from the first bit in the second window output sequence is less than 3, the second barrel shifter 104 generates the code value of 3-bit sequence by adding 1's as high-order bits of the 3-bit sequence. The second window output sequence from the second barrel shifter 104 is provided to a relay circuit 105 including two latch circuits 106 and 107, and a multiplexer(MUX) 108. The relay circuit 105 latches the second window output sequence for one-half clock duration time and provides the latched second window output sequence over the lead 127 to the memory device 200 as a decoding output sequence. More specifically, the second window output sequence on the lead 119 produced at a clock tick from the second barrel shifter 104 is latched in the latch circuit 106 or 107 in the relay circuit 105 at a next clock tick. The latch circuits 106 and 107 latch-in the data at their inputs at a different clock tick type of the clock signal, e.g., at the falling and the rising clock ticks of the CLK, respectively. The MUX 108 in the relay circuit 105 provides the second window output sequence as the decoding output sequence over the lead 127 to the memory device 200 and to the second barrel shifter 104 alternately from the latch circuit 106 in response to the falling clock tick and from 107 in response to the rising clock tick.

The memory device 200, which is coupled to the relay circuit 105, serves to produce a fixed-length word and a codeword length corresponding to a variable-length codeword that begins at the first bit position of the decoding output sequence. In a preferred embodiment of the invention, the memory device 200 includes a first and a second look-up tables 201 and 202, each of which may be implemented by, e.g., a programmable logic array(PLA). The first look-up table 201 is employed for pre_fix decoding to produce a codeword length, while the second look-up table 202 is employed for sub_fix decoding to produce a decoded word. The first look-up table 201 includes a pre_fix code table and a decoded word length table. A pre_fix code for each of the variable-length codewords is represented as an entry in the pre_fix code table, wherein each of the pre_fix codes consists of high-order P bits of each codeword, the high-order P bits being capable of indicating the length of each codeword and the maximum value of P being an integer smaller than the maximum length of the variable-length codeword, i.e., 8. Each table entry in the pre_fix code table has a length of 8 bits, and begins with an actual pre_fix code of variable, i.e., from 1 to P, e.g., 5 bits, length. Since pre_fix codes in a code library, which has the maximum length of 5 bits, have fewer than 8 bits, the bit positions in the table entry following the actual pre_fix code are designated as "don't care" positions. The length of a codeword is detected when a sequence from the MUX 108 in the relay circuit 105 matches one of the bit patterns stored in the pre_fix code table. Thus, for example, if one of the bit patterns of a pre_fix code in the pre_fix code table is "11", its 8-bit table entry will be "11XXXXXX", where each "X" represents a "don't care". If the 8-bit sequence from the MUX 108 has a pattern "1101 1010", then a match occurs on the first two bits. When the decoding output sequence on the lead 127 matches an entry in the pre_fix code table, the corresponding entry in the decoded word length table is activated. The decoded word length table outputs on the lead 211 the codeword length corresponding to the matched pre_fix code of the variable-length codeword in the pre_fix code table. This codeword length supplied to the second barrel shifter 104 via the lead 211, at a next clock tick, is used to control the shift of the slidable output window of the second barrel shifter 104, and is inputted into the second look-up table 202. The second look-up table 202 having a sub_fix code table, a codeword length table and a decoded word table, also receives the code value on the lead 121 from the second barrel shifter 104. The codeword length for each variable-length codeword is represented as an entry in the codeword length table; and a sub_fix code for each of the variable-length codewords is represented as an entry in the sub_fix code table, wherein each of the sub_fix codes consists of low-order Q bits of each codeword, the value of Q being equal to a value obtained by subtracting P from the maximum length of the variable-length codewords. Each table entry in the sub_fix code table has a length of 3 bits, and ends with an actual sub_fix code of variable, i.e., from 1 to Q bits, length. In case the actual sub_fix code has a length smaller than 3 bits, the bit positions in the table entry preceding the actual sub_fix code are designated as "don't care" positions. In the preferred embodiment of the invention, a variable-length codeword consists of the P-bit pre_fix code and the Q-bit sub_fix code. A fixed-length word is detected when the codeword length on the lead 211 and the code value on the lead 121 match one of the bit patterns stored in the respective codeword length and sub_fix code tables. For example, if one of the bit patterns of a sub_fix code in the sub_fix code table is "01", its 3-bit table entry will be "X01", where "X" represents a "don't care". If the code value on the lead 121 has a pattern "101", then a match occurs on the last two bits. As is described above, when the codeword length on the lead 211 and the code value on the lead 121 match entries in the codeword length and the sub_fix code tables, respectively, the corresponding entry in the decoded word table is activated. The decoded word table outputs on a lead 213 the fixed-length word corresponding to the matched sub_fix code and the codeword length in the respective sub_fix code and the codeword length tables.

In the meantime, the codeword length on the lead 211 is supplied to the accumulation block 300 which serves to accumulate the decoded codeword lengths and to generate the window control signal onto the lead 319, which represents the accumulated codeword length and is used to control the first barrel shifter 103.

The accumulation block 300 includes an adder 310, two latch circuits 320 and 330, and a MUX 340. The adder 310 adds the codeword length on the lead 211 to the previously accumulated codeword length on a lead 318 to provide it to the latch circuits 320 and 330 as a new accumulated codeword length, alternately, at each clock tick. In the preferred embodiment of the invention, the latch circuits 320 and 330 operate at a different type of the clock tick from each other. Therefore, e.g., at each rising clock tick, the output on a lead 315 of the adder 310 generated at the previous clock tick, i.e., the just previous falling clock tick, is latched in the latch circuit 320 and provided to the MUX 340 over a lead 316, while at each falling clock tick, the output of the adder 310 produced at the previous clock tick, i.e., the just previous rising clock tick, is latched in the latch circuit 330 and coupled to the MUX 340 through a lead 317. And the latch circuit 330 also detects the logic value of the most significant bit(MSB) of the codeword length latched in the latch circuit 330 and supplies it to the input buffer memory 50 via the lead 411 as a READ signal. Accordingly, if the codeword length latched in the latch circuit 330 is equal to or greater than "16", the MSB of the codeword length latched in the latch circuit 330 is "1" and a READ signal activated appears on the lead 411.

At the MUX 340, in turn, the codeword length of 5-bits supplied from the latch circuit 320 or 330 is outputted as the window control signal onto the lead 319 and also inputted to the adder 310 as the previously accumulated codeword length through the lead 318. However, if the codeword length on the lead 318 from the latch circuit 320 is equal to or greater than "16", i.e., twice the maximum bit length of the variable-length codewords, the MSB of the codeword length of 5-bits provided from the latch circuit 320 is reset to "0" before it is inputted to the adder 310 to thereby produce a previously accumulated modulo 16 codeword length onto the lead 318.

The window control signal on the lead 319 indicating the new accumulated codeword length produced at the adder 310 is provided to the first barrel shifter 103 to control the position of the slidable output window thereof. The MSB of the 5-bit window control signal is supplied to the latch circuits 101 and 102 as the CARRY signal through the lead 321 at each rising and falling clock tick. When the accumulated codeword length is greater than or equal to "16", the MSB of the window control signal is "1" and a CARRY signal activated appears on the lead 321.

The input buffer memory 50, in response to the READ signal, retrieves the next data segment and outputs it into the lead 111 at a rising clock tick. In response to the CARRY signal, the data segment on the lead 111 is brought into the latch circuit 101, and the contents of the latch circuit 101 is transferred into the latch circuit 102 at a falling clock tick.

Figure 2:
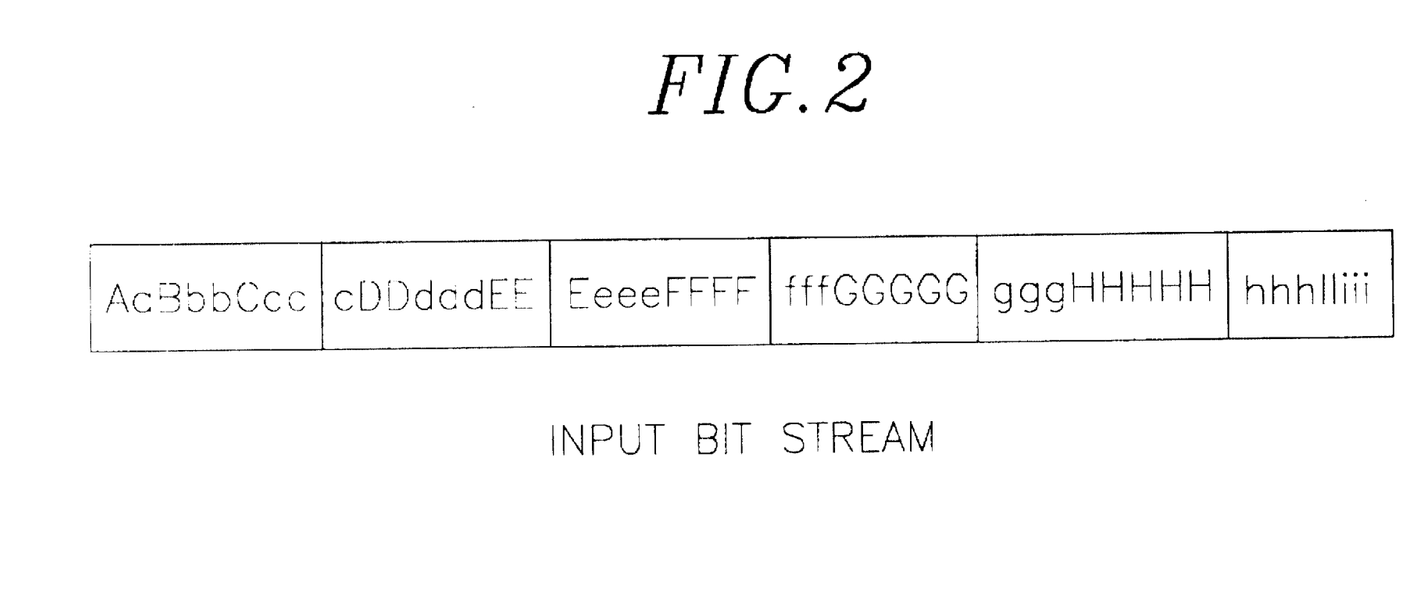
FIG. 2 depicts the input bit stream used for explaining the operation for the VLC decoding apparatus shown in FIG. 1.
Figure 3:
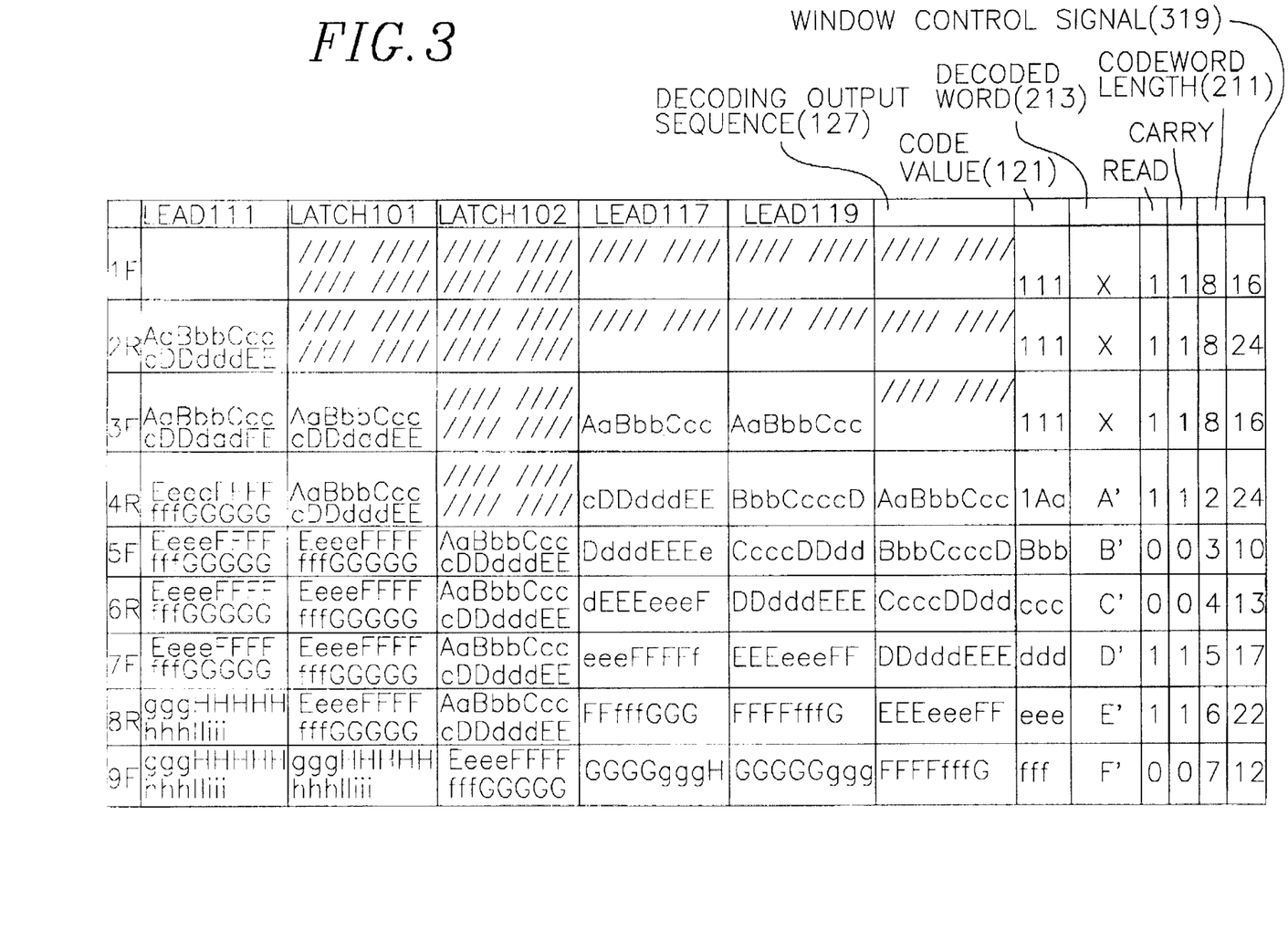
FIG. 3 provides an explanatory diagram for illustrating the operation of the VLC decoding apparatus shown in FIG. 1.

The operation of the decoder in FIG. 1 may be more readily understood with reference to an example shown in tabular form in FIGS. 2 and 3. It is assumed that the data stream inputted from the data channel 51 to the input buffer memory 50 shown in FIG. 1 consists of the bit stream "AaBbbCcc cDDdddEE EeeeFFFF fffGGGGG gggHH-HHH hhhHiii . . . ", as shown in FIG. 2, wherein "Aa" represents two bits in the first variable-length codeword, "A" and "a" being a respective pre_fix code and a sub_fix code of the first variable-length codeword; "Bbb" represents the three bits in the second variable-length codeword, "B" and "b" being a respective pre_fix code and a sub_fix code of the second variable-length codeword, etc.

Referring to FIG. 3, prior to the first clock tick of the falling edge, the 16-bit latch circuits 101 and 102 are initialized with a binary number "11111111 11111111", the output of the relay circuit 105 is initialized with "11111111", and the accumulation block 300 is initialized so that both the CARRY signal and the READ signal are "1". Specifically, at the first clock tick of the falling edge, the initialized output of the first look-up table 201 on the lead 211 is "8", so that the second barrel shifter 104 has an initial shift of "8". Since the latch circuit 330 is initialized with a binary number "10000", the READ signal is "1" and the accumulated codeword length is "16". The window control signal, indicating the newly accumulated codeword length on the lead 319 is "16" since the codeword length latched in the latch circuit 330 is the initialized value "16", and the newly accumulated codeword length is transferred onto the lead 318 as the previously accumulated codeword length.

At the second clock tick of the rising edge, since the output of the first look-up table 201 on the lead 211 initialized value "8" and the previously accumulated codeword length "16" on the lead 318 are added at the adder 310, the sum of the above "8" and "16" is inputted to the latch circuit 320 via the lead 315. Subsequently, the window control signal becomes "24" by accepting the codeword length latched in the latch circuit 320. At this time, the accumulated modulo codeword length, i.e., "8" is produced, by subtracting "16" from the codeword length retrieved from the latch circuit 320, and supplied onto the lead 318 as the previously accumulated codeword length. With the READ signal being "1", the first data segment consisting of the 16-bits of "AaBbbCcc cDDdddEE" is retrieved from the input buffer memory 50 onto a lead 111. In the meantime, the outputs of the latch circuits 101 and 102, the outputs of the barrel shifters 103 and 104 are initialized values, represented in FIG. 3 with "11111111" and "11111111", and the output of the second look-up table 202 is a noise value represented in FIG. 3 with an "X".

At the third clock tick of the falling edge, since the previous CARRY signal was "1", the data segment of "AaBbbCcc cDDdddEE" on the lead 111 is latched in the latch circuit 101. The output of the adder 310 becomes "16" by adding the previous decoded codeword length "8" on the lead 211 to the previously accumulated modulo 16 codeword length "8" on the lead 318 from the MUX 340. The output of the adder 310, i.e., "16" is latched in the latch circuit 330 and transferred onto the lead 319 as the window control signal. Therefore, the READ signal and the CARRY signal remain as "1", and the first barrel shifter 103 outputs a sequence of the 17th–24th bits, i.e., "AaBbbCcc", in the 48-bits data segments, i.e., "11111111 11111111 AaBbbCcc cDDdddEE AaBbbCcc cDDdddEE", inputted thereto, to the second barrel shifter 104 over the lead 117. The output sequence from the relay circuit 105 has its initialized value and the codeword length output of the first look-up table 201 remains to be "8" as initialized, so that the second barrel shifter 104 outputs a sequence of the 9th–16th bits, i.e., "AaBbbCcc", in its two input data segments, i.e., "11111111 AaBbbCcc" to the relay circuit 105 through the lead 119 and simultaneously produces the 6th–8th bits, i.e., "111", from "11111111 AaBbbCcc" to the second look-up table 202, over the lead 121, as the code value. The latch circuit 102 contains its initialized value, and the decoded word of the second look-up table 202 contains noise value.

At the fourth clock tick of the rising edge, the READ signal remains to be "1", wherein a next data segment of "EeeeFFFF fffGGGGG" is outputted from the input buffer memory 50 onto the lead 111. The output of the adder 310 becomes "24" by adding the previous decoded codeword length "8" on the lead 211 to the previously accumulated codeword length "16" on the lead 318 from the MUX 340. The output of the adder 310, i.e., "24" is latched in the latch circuit 320 and transferred onto the lead 319 as the window control signal. Thereafter, the CARRY signal remains to be "1", and the first barrel shifter 103 outputs the sequence of "cDDdddEE" from the data segments of "11111111 11111111 AaBbbCcc cDDdddEE EeeeFFFF fffGGGGG" inputted thereto, to the second barrel shifter 104. The sequence of "AaBbbCcc" previously held in the relay circuit 105 at the third falling clock tick, is supplied over the lead 127 as the decoding output sequence to the first look-up table 201, and to the second barrel shifter 104. The first look-up table 201 recognizes the first one bit, i.e., "A" in the decoding output sequence of "AaBbbCcc" and outputs the decoded codeword length, e.g., "2" corresponding to the recognized pre_code entry therein onto the lead 211. The decoded codeword length, "2", on the lead 211 is then coupled to the second look-up table 202 and to the second barrel shifter 104 which outputs the 3rd–10th bits, i.e., "BbbCcccD", in the input data segments of "AaBbbCcc cDDdddEE" to the relay circuit 105 over the lead 119 and transfers 3-bit sequence of "1Aa" as the code value to the second look-up table 202 over the lead 121. The second look-up table 202 recognizes the decoded codeword length, "2", and the code value, "1Aa", and outputs the fixed-length decoded word, e.g., "A" corresponding to the recognized codeword length and sub_fix code entries therein, onto the lead 213. On the lead 318, "8" is coupled as the previously accumulated modulo 16codeword length obtained by subtracting "16" from the widow control signal "24".

At the fifth clock tick of the falling edge, since the previous CARRY signal is "1", the data segment of "EeeeF-FFF fffGGGGG" on the lead 111 is latched in the latch circuit 101; and the data segment of "AaBbbCcc cDDdddEE" previously held in the latch circuit 101 is latched into the latch circuit 102. The output of the adder 310 becomes "10" by adding the previous decoded codeword length "2" to the previously accumulated modulo 16codeword length "8". The output of the adder 310, i.e., "10" is latched in the latch circuit 330 and transferred onto the lead 319 as the window control signal. Accordingly, the READ signal and the CARRY signal become "0", and the first barrel shifter 103 outputs the sequence of "DdddEEEe" from the data segments of "AaBbbCcc cDDdddEE EeeeFFFF fffGGGGG EeeeFFFF fffGGGGG" to the second barrel shifter 104. The output sequence of "BbbCcccD" previously held in the relay circuit 105 at the fourth rising clock tick is provided to the first look-up table 201 and the second barrel shifter 104. The first look-up table 201 recognizes the first one bit, i.e., "B" in the decoding output sequence of "BbbCcccD" and outputs the decoded codeword length, e.g., "3" corresponding to the recognized pre_fix code entry therein onto the lead 211. The decoded codeword length, "3", on the lead 211 is then coupled to the second look-up table 202 and to the second barrel shifter 104 which outputs the sequence of "CcccDDdd" in the "BbbCccD DdddEEEe" and transfers 3-bit sequence of "Bbb" as the code value to the second look-up table 202. The second look-up table 202 recognizes the decoded codeword length, "3", and the code value, . "Bbb", and outputs the fixed-length decoded word, e.g., "B'" corresponding to the recognized codeword length and sub_ fix code entries therein, onto the lead 213.

At the sixth clock tick of the rising edge, since the READ signal still remains to be "0", the data segment on the lead 111 remains unchanged. The output of the adder 310 becomes "13" by adding the previous decoded codeword length "3" to the previously accumulated codeword length "10". The output of the adder 310, i.e., "13" is latched in the latch circuit 320 and transferred onto the lead 319 as the window control signal. Therefore, the CARRY signal remains to be "0", and the first barrel shifter 103 outputs the sequence of "dEEEeeeF" from "AaBbbCcc cDDdddEE EeeeFFFF fffGGGGG gggHHHHH hhhIIiii" to the second barrel shifter 104. The output sequence of "CcccDDdd" previously held in the relay circuit 105 at the fifth falling clock tick is coupled to the first look-up table 201 and the second barrel shifter 104. The first look-up table 201 recognizes the first one bit, i.e., "C" in the decoding output sequence of "CcccDDdd" and outputs the decoded codeword length, e.g., "4" corresponding to the recognized pre_fix code entry therein onto the lead 211. The decoded codeword length, "4", on the lead 211 is then coupled to the second look-up table 202 and to the second barrel shifter 104 which outputs the 8-bit sequence of "DDdddEEE" in the "CcccDDdd dEEEeeeF" to the relay circuit 105 and transfers 3-bit sequence of "ccc" as the code value to the second look-up table 202. The second look-up table 202 recognizes the decoded codeword length, "4", and the code value, "ccc", and outputs the fixed-length decoded word, e.g., "C'" corresponding to the recognized codeword length and sub_ fix code entries therein, onto the lead 213.

At the seventh clock tick of the falling edge, since the previous CARRY signal is "0", the three data segments inputted to the first barrel shifter 103 remains unchanged. The output of the adder 310 becomes "17" by adding the previous decoded codeword length "4" to the previously accumulated modulo 16 codeword length "13". The output of the adder 310, i.e., "17" is latched in the latch circuit 330 and transferred onto the lead 319 as the window control signal. Accordingly, the READ signal and CARRY signal become "1", and the first barrel shifter 103 outputs the sequence of "eeeFFFFf" from "AaBbbCcc cDDdddEE EeeeFFFF fffGGGGG gggHHHHH hhhIIiii" to the second barrel shifter 104. The output sequence of "DDdddEEE" previously held in the relay circuit 105 at the sixth rising clock tick is fed to the first look-up table 201 and the second barrel shifter 104. The first look-up table 201 recognizes the first two bits, i.e., "DD" in the decoding output sequence of "DDdddEEE" and outputs the decoded codeword length, e.g., "5" corresponding to the recognized pre_fix code entry therein onto the lead 211. The decoded codeword length, "5", on the lead 211 is then coupled to the second look-up table 202 and to the second barrel shifter 104 which outputs the sequence of "EEEeeeFF" from the "DDdddEEE eeeFFFF" to the relay circuit 105 and transfers 3-bit sequence of "ddd" as the code value to the second look-up table 202. The second lookup table 202 recognizes the decoded codeword length, "5", and the code value, "ddd", and outputs the fixed-length decoded word, e.g., "D'" corresponding to the recognized codeword length and sub_fix code entries therein, onto the lead 213.

At the eighth clock tick of the rising edge, since the previous READ signal remains to be "1", wherein a next data segment of "gggHHHHH hhhIIiii" is outputted from the input buffer memory 50 onto the lead 111. The output of the adder 310 becomes "22" by adding the previous decoded codeword length "5" to the previously accumulated codeword length "17". The output of the adder 310 is latched in the latch circuit 320 and transferred onto the lead 319 as the window control signal. Hence, the CARRY signal remains to be "1", and the first barrel shifter 103 outputs the sequence of "FFfffGGG" from "AaBbbCcc cDDdddEE EeeeFFFF fffGGGGG gggHHHHH hhhIIiii" to the second barrel shifter 104. The output sequence of "EEEeeeFF" previously held in the relay circuit 105 at the seventh falling clock tick is supplied to the first look-up table 201 and the second barrel shifter 104. The first look-up table 201 recognizes the first three bits, i.e., "EEE" in the decoding output sequence of "EEEeeeFF" and outputs the decoded codeword length, e.g., "6" corresponding to the recognized pre_fix code entry therein onto the lead 211. The decoded codeword length, "6", on the lead 211 is then coupled to the second look-up table 202 and to the second barrel shifter 104 which outputs the 8-bit sequence of "FFFFfffG" from "EEEeeeFF FFfffGGG" to the relay circuit 105 and transfers 3-bit sequence of "eee" as the code value to the second look-up table 202. The second look-up table 202 recognizes the decoded codeword length, "6", and the code value, "eee", and outputs the fixed-length decoded word, e.g., "E'" corresponding to the recognized codeword length and sub_fix code entries therein, onto the lead 213. On the lead 318, "6" is coupled as the previously accumulated modulo 16 codeword length obtained by subtracting "16" from the widow control signal "22".

At the ninth clock tick of the falling edge, since the previous CARRY signal is "1", the data segment of "gggHHHHH hhhIIiii" on the lead 111 is latched in the latch circuit 101; and the data segment of "EeeePFFF fffGGGGG" previously held in the latch circuit 101 is latched into the latch circuit 102. The output of the adder 310 becomes "12" by adding the previous decoded codeword length "6" to the previously accumulated modulo 16 codeword length "6". The output of the adder 310 is latched in the latch circuit 330 and transferred onto the lead 319 as the window control signal. Consequently, both the READ signal and the CARRY signal become "0", and the first barrel shifter 103 outputs the sequence of "GGGGgggH" of from "EeeeFFFF fffGGGGG gggHHHHH hhhIIiii gggHHHHH hhhIIiii" to the second barrel shifter 104. The output sequence of "FFFFfffG" previously held in the relay circuit 105 at the eighth rising clock tick is applied to the first look-up table 201 and the second barrel shifter 104. The first look-up table 201 recognizes the first four bits, i.e., "FFFF" in the decoding output sequence of "FFFFfffG" and outputs the decoded codeword length, e.g., "7" corresponding to the recognized pre__fix code entry therein onto the lead 211. The decoded codeword length, "7", on the lead 211 is then coupled to the second look-up table 202 and to the second barrel shifter 104 which outputs the sequence of "GGGGGggg" from "FFFFfffG GGGGgggH" to the relay circuit 105 and transfers 3-bit sequence of "fff" as the code value to the second look-up table 202. The second look-up table 202 recognizes the decoded codeword length, "7", and the code value, "fff", and outputs the fixed-length decoded word, e.g., "F" corresponding to the recognized codeword length and sub__fix code entries therein, onto the lead 213.

As may be seen from the above, it should be readily appreciated that the VLC decoding apparatus of the present invention carries out a decoding operation at each clock tick of the clock signal, thereby advantageously achieving a high smeed decoding operation. Also, the structural complexity of the apparatus can be reduced by employing the accumulation block 300 containing the adder 310, two latch circuits 320 and 330, and the MUX 340.

While the present invention has been described with respect to the particular embodiments, it will be apparent to those skilled in the art that various changes and modifications may be made without departing from the spirit and scope of the invention as defined in the following claims.

What is claimed is:

1. A variable-length code decoding apparatus for decoding, based on a clock signal having a rising clock tick and a falling clock tick, at a half clock cycle rate, an input bit stream of variable-length codewords, the input bit stream being in fixed-length segments equal in their bit length to twice a longest length of the variable-length codewords, which comprises:

a first and a second cascaded bit storage means for sequentially storing consecutive fixed-length segments of bits from the input bit stream;

a shift means, connected to the first and second bit storage means and having a window, for storing bits received from the first and second bit storage means and providing a window output sequence of consecutive fixed-length segments from bits stored therein, the bit length of the first window output sequence being equal to the longest length of the variable-length codewords, the window being directly slidable across the bits stored in the shift means and the position of the window being determined during each half clock cycle by a window control signal;

a relay means for latching the window output sequence for one-half the clock cycle and producing the latched window output sequence as a decoding output sequence;

a first memory means coupled to the relay means for producing a codeword length in response to a pre__fix code which consists of high-order P bits of a variable-length codeword that begins at a first bit position of the decoding output sequence, the maximum value of P being an integer smaller than the longest length of the variable-length codewords;

a second memory means, connected to the first memory means and the shift means, for producing a fixed-length word in response to the codeword length and the window output sequence; and an accumulation means for adding during each half clock cycle the codeword length to previously accumulated codeword lengths of variable-length codewords decoded during previous clock cycles, generating the window control signal during each half clock cycle to directly shift the window by the number of bits in the window control signal, generating a READ signal to retrieve a next fixed-length segment in the input bit stream into the second storage means and producing a CARRY signal to transfer the sequence of bits in the second storage means to the first storage means when the accumulated codeword lengths indicate that all the bits in the first storage means have been decoded.

2. The apparatus as recited in claim 1, wherein the transfer of bit sequence in the second storage means to the first storage means and the reading of the next fixed-length segment in the input bit stream are carried out at mutually different types of clock ticks.

3. The apparatus as recited in claim 2, wherein the accumulation means includes:

an addition means for adding the codeword length supplied from the first memory means to the previously accumulated codeword lengths;

a latch means, consisting of a first and a second latch circuits, for latching the output of the addition means alternately at a half clock cycle rate, wherein the second latch circuit detects and outputs the logic value of the most significant bit of the latched codeword lengths therein as the READ signal; and a multiplex means for generating the window control signal based on the latched codeword length supplied from the latch means at the half clock cycle rate to shift the window and also providing the most significant bit of the window control signal to the storage means as the CARRY signal, the multiplex means subtracting twice the longest length of the variable-length codewords from the latched codeword length provided from the first latch circuit when the latched codeword length is greater than twice the longest length of the variable-length codewords and producing, in turn, the subtracted codeword length and the latched codeword length from the second latch circuit to the addition means as the previously accumulated codeword lengths.

4. The apparatus as recited in claim 3, wherein the reading of the next fixed-length segment in the input bit stream is carried out in response to the READ signal generated at the second latch circuit during an immediately preceding half clock cycle.

5. The apparatus as recited in claim 4, wherein the first memory means employs a pre__fix code table and a decoded word length table, the pre__fix code of the variable-length codewords being represented as an entry in the pre__fix code table and the decoded word length table outputting the codeword length corresponding to the pre__code.

6. The apparatus as recited in claim 5, wherein the second memory means employs a sub__code table, a codeword length table and a decoded word table, the codeword length for each variable-length codeword being represented as an entry in the codeword length table, a sub__code for each of the variable-length codewords being represented as an entry in the sub__fix code table, the decoded word table outputting a fixed-length word corresponding to the sub__code and the codeword length.

7. A variable-length code decoding apparatus for decoding, based on a clock signal having a rising clock tick and a falling clock tick, at a half clock cycle rate, an input bit stream of variable-length codewords, the input bit stream being in fixed-length segments equal in their bit length to twice a longest length of the variable-length codewords, which comprises:

a buffer means for storing the input bit stream and sequentially outputting it per fixed-length segment;

a first and a second cascaded bit storage means for sequentially storing fixed-length segments retrieved from the buffer means on a segment-by-segment basis;

a first shift means, connected to the first and the second cascaded bit storage means and having a first output window, for storing bits received from the first and the second bit storage means and producing a first window output sequence from bits stored therein in consecutive fixed-length segments, the bit length of the first window output sequence being equal to the longest length of the variable-length codewords and the first output window being shifted across the bits stored in the first shift means in direct response to a window control signal;

a second shift means, connected to the first shift means and having a second output window, for storing bits contained in the first window output sequence and a previous decoding output sequence applied thereto, producing a second window output sequence from bits stored therein, and generating high-order M bits from the first bit in the second window output sequence as a code value, the bit length of the second window output sequence being equal to the longest length of the variable-length codewords, the second output window being shifted in direct response to a codeword length and M being an integer smaller than the longest length of the variable-length codewords;

a relay means for latching the second window output sequence for one-half the clock cycle, producing the latched second window output sequence as a decoding output sequencer, and supplying it to the second shift means as a previous decoding output sequence;

a first memory means coupled to the relay means for producing a codeword length in response to a pre__fix code which consists of high-order P bits of a variable-length codeword that begins at a first bit position of the decoding output sequence provided from the relay means, the maximum value of P being an integer smaller than the longest length of the variable-length codewords and providing the codeword length to the second shift means;

a second memory means, connected to the first memory means and the second shift means, for producing a fixed-length word in response to the codeword length and the code value; and an accumulation means for adding the codeword length to previously accumulated codeword length in order to produce the window control signal indicating the added and accumulated codeword length, the accumulation means generating a READ signal and a CARRY signal when the accumulated codeword length is greater than twice the longest length of the variable-length codewords, the buffer means retrieving a next fixed-length segment in response to the READ signal and the next fixed-length segment being stored in the second bit storage means and the fixed-length segment previously stored in the second bit storage means being transferred to the first bit storage means in response to the CARRY signal.

8. The apparatus as recited in claim 7, wherein the transference of the fixed-length segment previously stored in the second storage means to the first storage means and the reading of the next fixed-length segment stored in the buffer means are carried out an mutually different types of clock ticks.

9. The apparatus as recited in claim 8, wherein the accumulation means includes:

an addition means for adding the codeword length supplied from the first memory means to the previously accumulated codeword lengths;

a latch means, consisting of a first and a second latch circuits, for latching the output of the addition means alternately at a half clock cycle rate, wherein the second latch circuit detects and outputs the logic value of the most significant bit of the latched codeword lengths therein to the buffer means as the READ signal; and a multiplex means for generating the window control signal based on the latched codeword length supplied from the latch means at the half clock cycle rate and also providing the most significant bit of the window control signal to the storage means as the CARRY signal, the multiplex means subtracting twice the longest length of the variable-length codewords from the latched codeword length provided from the first latch circuit when the latched codeword length is greater than twice the longest length of the variable-length codewords and producing, in turn, the subtracted codeword length and the latched codeword length from the second latch circuit to the addition means as the previously accumulated codeword length.

10. The apparatus as recited in claim 9, wherein the reading of the next fixed-length segment in the buffer means is carried out in response to the READ signal generated at the second latch circuit during an immediately preceding half clock cycle.

11. The apparatus as recited in claim 10, wherein the first memory means employs a pre__fix code table and a decoded word length table, the pre__fix code of the variable-length codewords being represented as an entry in the pre__fix code table and the decoded word length table outputting the codeword length corresponding to the pre__fix code.

12. The apparatus as recited in claim 11, wherein the second memory means employs a sub__fix table, a codeword length table and a decoded word table, the codeword length for each variable-length codeword being represented as an entry in thee codeword length table, the sub__fix code for each of the variable-length codewords being represented as an entry in the sub__fix code table, the decoded word table outputting the fixed-length word corresponding to the sub__fix code and the codeword length.

13. A method for decoding, according to a clock signal having a rising clock tick and a falling clock tick, at a half clock cycle rate, an input bit stream of variable-length codewords, the input bit stream being in fixed-length segments equal in bit-length to twice a longest length of the variable-length codewords, which comprises the steps of:

(a) storing first and second sequential fixed-length segments of the input bit stream;

(b) forming from said two stored fixed-length segments a decoding window of a subsequence of input bits which has equal bit length to the longest length of the variable-length codewords during each half clock cycle;

(c) comparing the initial bits in the decoding window with all possible variable-length codewords to determine one matching variable-length codeword;

(d) generating a codeword length during each half clock cycle that represents the bit-length of the matched variable-length codeword;

(e) producing a fixed-length word corresponding to the matched variable-length codeword during each half clock cycle;

(f) summing the generated codeword length and a previously accumulated codeword length during each half clock cycle;

(g) directly shifting the decoding window during each half clock cycle by the number of bits in the matched variable-length codeword;

(h) reading in a next fixed-length segment of the input bit stream when the accumulated codeword length indicates that all the bits in the first fixed-length segment have been decoded;

(i) storing the second fixed-length segment of input bits in place of the first fixed-length segment of bits while storing the next fixed-length segment of input bit stream read in step (h) in place of the second fixed-length segment of input bits when the accumulated codeword length indicates that all the bits in the first fixed-length segment have been decoded;

(j) subtracting twice the longest length of the variable-length codewords from the accumulated codeword length when the accumulated codeword length exceeds twice the longest length of the variable-length codewords; and (k) repeating steps (a) to (j) until all the variable-length codewords in the input bit stream are decoded.

14. The method as recited in claim 13, wherein the steps (h) and (i) are carried out at mutually different types of clock ticks.

* * * * *